United States Patent
Bai et al.

(10) Patent No.: US 7,622,395 B2
(45) Date of Patent: Nov. 24, 2009

(54) TWO-STEP METHOD FOR ETCHING A FUSE WINDOW ON A SEMICONDUCTOR SUBSTRATE

(75) Inventors: Shi-Jie Bai, Singapore (SG); Hong Ma, Singapore (SG)

(73) Assignee: United Microelectronics Corp., Hsin-Chu (TW)

( * ) Notice: Subject to any disclaimer, the term of this patent is extended or adjusted under 35 U.S.C. 154(b) by 379 days.

(21) Appl. No.: 11/616,300

(22) Filed: Dec. 27, 2006

(65) Prior Publication Data

US 2008/0160652 A1 Jul. 3, 2008

(51) Int. Cl.
*H01L 21/302* (2006.01)

(52) U.S. Cl. .................. 438/723; 438/700; 438/702

(58) Field of Classification Search .......... 438/700, 438/702, 704, 706, 712, 714, 723, 724, 725
See application file for complete search history.

(56) References Cited

U.S. PATENT DOCUMENTS

| | | | |
|---|---|---|---|
| 5,989,784 A | 11/1999 | Lee | |
| 6,194,318 B1 * | 2/2001 | Ikeda | 438/699 |
| 6,300,252 B1 | 10/2001 | Ying | |
| 6,677,226 B1 * | 1/2004 | Bowen et al. | 438/601 |
| 6,911,386 B1 * | 6/2005 | Lee et al. | 438/612 |
| 7,144,749 B2 * | 12/2006 | Ng et al. | 438/48 |
| 2002/0079552 A1 * | 6/2002 | Koike | 257/529 |
| 2004/0171263 A1 * | 9/2004 | Choi et al. | 438/691 |
| 2005/0087837 A1 * | 4/2005 | Omura et al. | 257/529 |
| 2005/0189612 A1 * | 9/2005 | Hung et al. | 257/529 |
| 2005/0233515 A1 * | 10/2005 | Ng et al. | 438/200 |

* cited by examiner

*Primary Examiner*—Kin-Chan Chen
(74) *Attorney, Agent, or Firm*—Winston Hsu

(57) ABSTRACT

A two-step method for etching a fuse window on a semiconductor substrate is provided. A semiconductor substrate having thereon a fuse interconnect-wire is formed in a dielectric film stack. The dielectric film stack includes a target dielectric layer overlying said fuse interconnect-wire, an intermediate dielectric layer and a passivation layer. A photoresist layer is formed on the passivation layer with an opening that defines said fuse window. A first dry etching process is performed to non-selectively etch the passivation layer and the intermediate dielectric layer through the opening thereby exposing the target dielectric layer. The thickness of the target dielectric layer after the first dry etching process is then measured. An APC-controlled second dry etching process is performed to etch a portion of the exposed target dielectric layer, thereby reliably forming the fuse window.

22 Claims, 14 Drawing Sheets

TWO-STEP METHOD FOR ETCHING A FUSE WINDOW ON A SEMICONDUCTOR SUBSTRATE

BACKGROUND OF THE INVENTION

1. Field of the Invention

The present invention relates generally to the field of semiconductor fabrication and, more particularly, to a two-step method for reliably etching a very-high aspect ratio fuse window on a semiconductor substrate involving the use of advanced process control (APC). The remaining thickness of the target layer at the bottom of the fuse window can be precisely controlled.

2. Description of the Prior Art

Semiconductor devices having a redundancy circuit for disabling defects components are known in the art. Most redundancy circuits have fuse interconnect-wires. The fuse interconnect-wires may be blown when applied with a laser beam, to disconnect the defective components from the normally functioning components.

FIG. 1 illustrates a typical cross-section view of a fuse interconnect-wire 10 that is formed concurrently with a multi-layered interconnect-wire structure 12 on a silicon substrate 100. As shown in FIG. 1, the interconnect-wire structure 12 comprises a lower inlaid wire layer 122 that is generally formed of copper by using copper damascene processes. The lower inlaid wire layer 122 may be, but not limited to, a fifth metal (M5) layer of the multi-layered interconnect-wire structure 12 wherein the first to fourth metal (M1-M4) layers are not shown in this figure for the sake of simplicity. The lower inlaid wire (M5) layer 122 is embedded in an insulating dielectric layer 113 and etch stop layer 114.

The interconnect-wire structure 12 further comprises an inlaid wire (M6) layer 124 embedded in an insulating dielectric layer 109 and etch stop layer 110. The inlaid wire (M6) layer 124 is electrically interconnected with the lower inlaid wire (M5) layer 122 through the via 123 that is embedded in the insulating dielectric layer 111 and cap layer 112. The interconnect-wire structure 12 further comprises an inlaid wire (M7) layer 126 embedded in an insulating dielectric layer 105 and etch stop layer 106. The inlaid wire (M7) layer 126 is electrically interconnected with the inlaid wire (M6) layer 124 through via 125 that is embedded in the insulating dielectric layer 107 and cap layer 108. The interconnect-wire structure 12 further comprises a bonding pad layer 128 that is generally formed of Al, AlCu, Cu, or a composite.

The bonding pad layer 128 is electrically interconnected with the underlying inlaid wire (M7) layer 126 through via 127 that is embedded in the insulating dielectric layer 103 and cap layer 104. The bonding pad layer 128 is protected with a passivation layer 101 and dielectric layer 102. An opening 130 is formed in the passivation layer 101 to expose a portion of the top surface of the bonding pad layer 128.

Typically, the insulating dielectric layers 105, 107, 109, 111 and 113 are made of low dielectric constant (low-k) materials such as FSG or the like. The etch stop layers 106, 110 and 114 are made of PECVD nitride, LPCVD nitride or oxy-nitride. The cap layers 104, 108, 110 and 112 are made of PECVD nitride, LPCVD nitride, carbide, silicon carbonitride or oxy-nitride. The dielectric layer 102 is generally formed of silicon oxide such as PECVD oxide. The passivation layer 101 is generally formed of silicon nitride.

In this case, the fuse interconnect-wire 10 is formed concurrently with the lower inlaid wire (M5) layer 122 of the interconnect-wire structure 12. A so-called fuse window for laser ablation is provided directly above the fuse interconnect-wire 10. The fuse window is a recessed opening with a very-high aspect ratio that is located directed above the fuse interconnect-wire 10 with the bottom of the fuse window not exposing the fuse interconnect-wire 10.

The process for etching the fuse window is illustrated through FIGS. 2-4. As shown in FIG. 2, a photoresist layer 150 is coated on the passivation layer 101. A typical lithographic process is carried out to form an opening 160 in the photoresist layer 150. The opening 160 is situated directly above the fuse interconnect-wire 10 and defines the fuse window to be etched into the substrate 100. As shown in FIG. 3, a single-step non-stop dry etching process is then carried to consecutively etch the layers 101-111, thereby forming a fuse window 200 having a depth of, for example, 40000-50000 angstroms. In this case, a total of 11 consecutive layers including five different types of dielectric materials are etched.

Since the fuse interconnect-wire 10 is subject to oxidation, it is undesired to fully open the bottom of the fuse window 200 to thereby expose the surface of the fuse interconnect-wire 10. It is required that the single-step non-stop dry etching process eventually stops on the insulating dielectric layer 111, hereinafter also referred to as "target layer". In order to increase the reliability of the fuse blow, it is important to control the remaining thickness of the target layer 111. Normally, it is desired to form a fuse window 200 with a target layer 111 having a remaining thickness of about 2000 angstroms. As shown in FIG. 4, after measuring the remaining thickness of the etched target layer 111, the photoresist layer 150 is then stripped.

However, the prior art single-step non-stop dry etching process is time-consuming and is not reliable. According to the prior art, the single-step non-stop dry etching process is carried out using endpoint mode and has to employ different etching recipes for selectively etching corresponding consecutive material layers above the target layer 111 under said endpoint mode. According to the prior art, the respective etching rates for etching through the consecutive layers 101-111 are basically different. The complex dielectric film stack (typically eleven consecutive layers with five different dielectric materials) over the fuse interconnect-wire 10 introduces variations and accumulated errors of the final result, and the out of spec (OOS) ratio is usually as high as 50% or even higher. Also, the low transition rate during the etching of the fuse window is another problem and most of final products have to be processed and tuned again after measurement, therefore, more manufacturing trouble is incurred. In light of the above, there is a need in this industry to provide an improved method for forming the fuse window.

SUMMARY OF THE INVENTION

It is therefore the primary object of the present invention to provide a two-step method for reliably etching a very-high aspect ratio fuse window on a semiconductor substrate involving the use of advanced process control to solve the above-described problems.

According to the claimed invention, a two-step method for etching a fuse window on a semiconductor substrate is disclosed. A semiconductor substrate having thereon a fuse interconnect-wire is embedded in a dielectric film stack, wherein the dielectric film stack comprises a target dielectric layer overlying the fuse interconnect-wire, at least one intermediate dielectric material layer overlying the target dielectric layer, and a passivation layer overlying the intermediate dielectric material layer. A lithographic process is performed to form a photoresist layer over the passivation layer, wherein the photoresist layer has an opening that is directly above the fuse interconnect-wire and defines the fuse window. A first dry etching process is then performed to non-selectively etch the passivation layer and the intermediate dielectric material layer through the opening thereby exposing the target dielectric layer. A first thickness-measurement step is performed to measure thickness of the target dielectric layer after the first dry etching process. A second dry etching process is performed, based on the measured thickness of the target dielectric layer in the first thickness-measurement step, to etch a portion of the exposed target dielectric layer, thereby forming the fuse window. A second thickness-measurement step is performed to measure a remaining thickness of the target dielectric layer after the second dry etching process. The photoresist layer is then stripped.

From another aspect of this invention, a two-step method for etching a fuse window on a semiconductor substrate is provided. A semiconductor substrate having thereon a fuse interconnect-wire is embedded in a dielectric film stack, wherein the dielectric film stack comprises a target dielectric layer overlying the fuse interconnect-wire, a first intermediate dielectric material layer overlying the target dielectric layer, a second intermediate dielectric material layer overlying the first intermediate dielectric material layer, and a passivation layer overlying the second intermediate dielectric material layer. A lithographic process is performed to form a photoresist layer over the passivation layer, wherein the photoresist layer has an opening that is directly above the fuse interconnect-wire and defines the fuse window. A first dry etching process is performed to non-selectively etch the passivation layer and the second intermediate dielectric material layer through the opening thereby forming an intermediate fuse window in the passivation layer and the second intermediate dielectric material layer. A first thickness-measurement step is performed to measure combined thickness of remaining the second intermediate dielectric material layer, the first intermediate dielectric material layer and the target dielectric layer after the first dry etching process. A second dry etching process is performed, based on the measured thickness obtained from the first thickness-measurement step, to continue to etch the second intermediate dielectric material layer, the first intermediate dielectric material layer and a portion of the exposed target dielectric layer through the intermediate fuse window, thereby forming the fuse window. A second thickness-measurement step is then performed to measure a remaining thickness of the target dielectric layer after the second dry etching process. Thereafter, the photoresist layer is stripped.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 8:
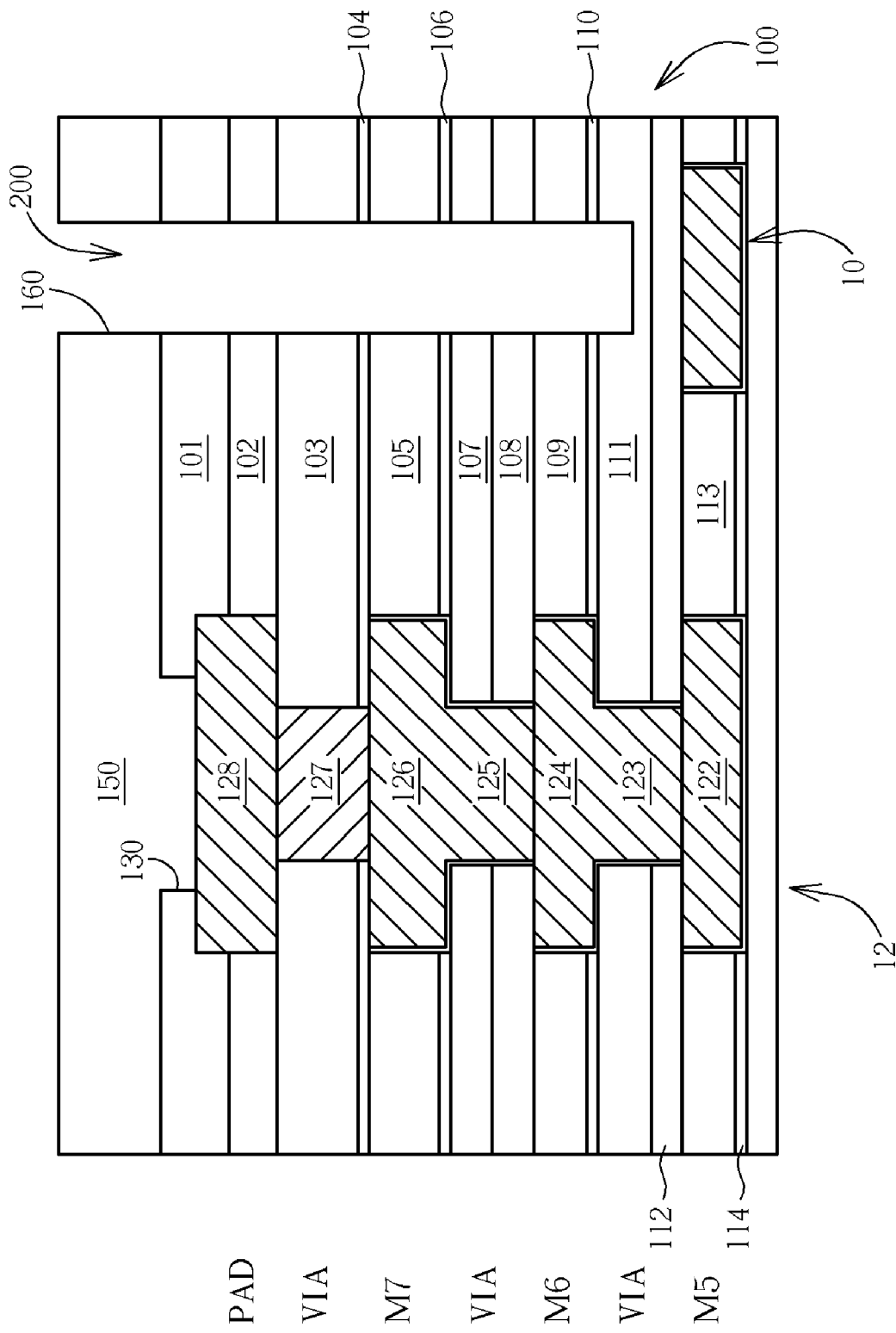
Figure 9:
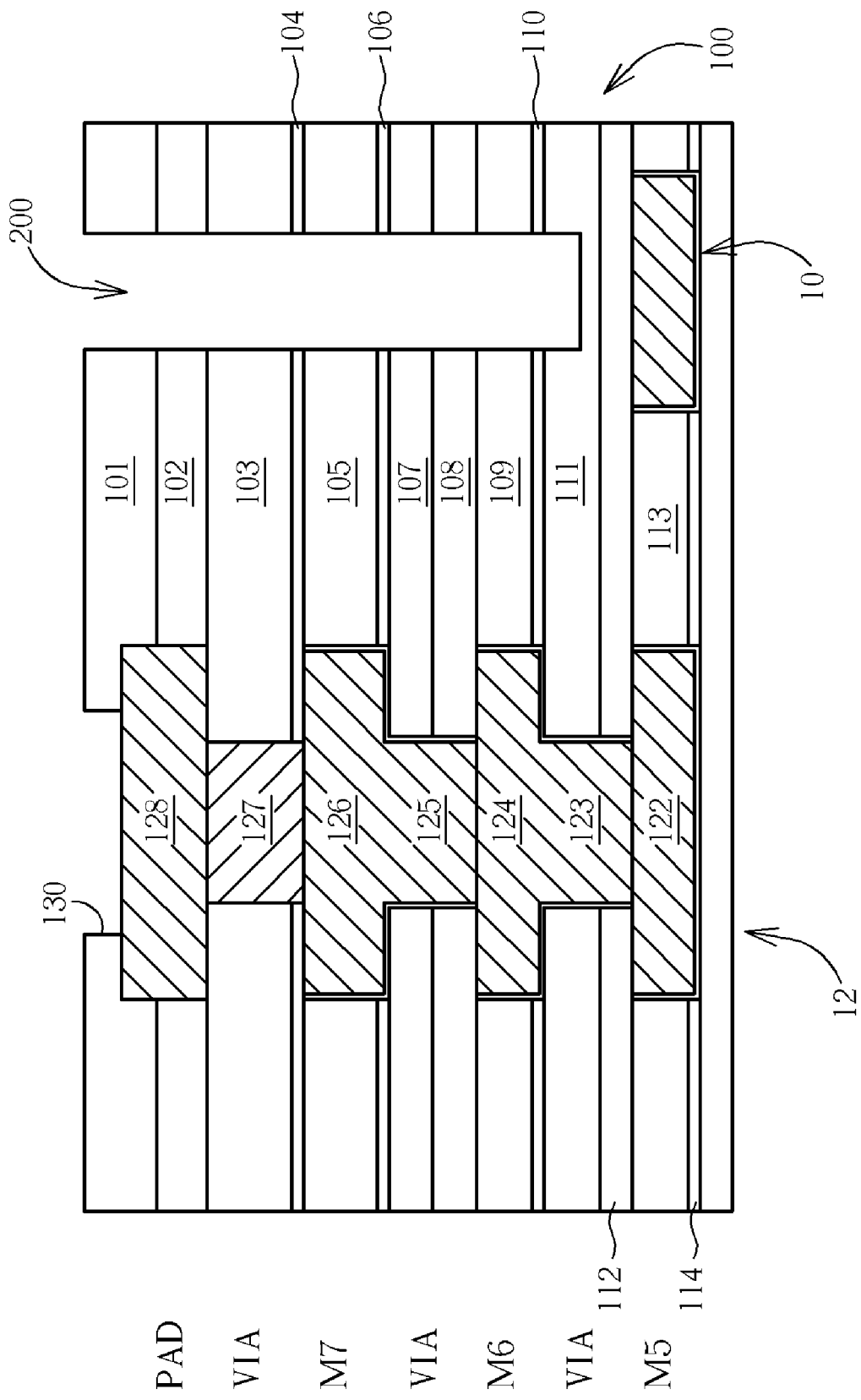
Figure 10:
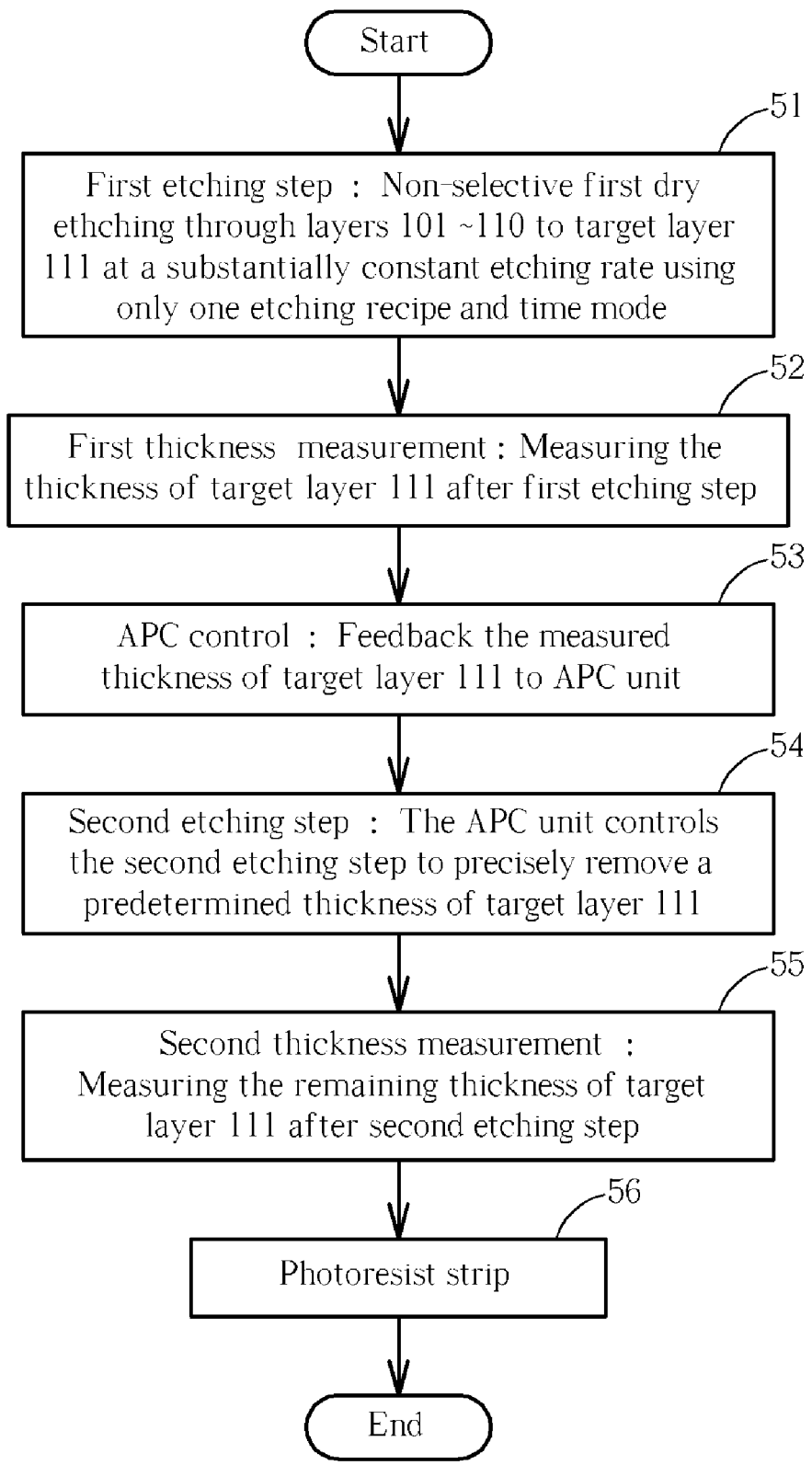
FIG. 10 is a flow chart summarizing the two-step method of this invention.

Please refer to FIGS. 5-10. FIGS. 5-9 are schematic diagrams showing the two-step method for forming a fuse window on a semiconductor substrate in accordance with one preferred embodiment, wherein like numerals designate like elements, devices, regions or layers. FIG. 10 is a flow chart summarizing the two-step method of this invention.

Figure 1:
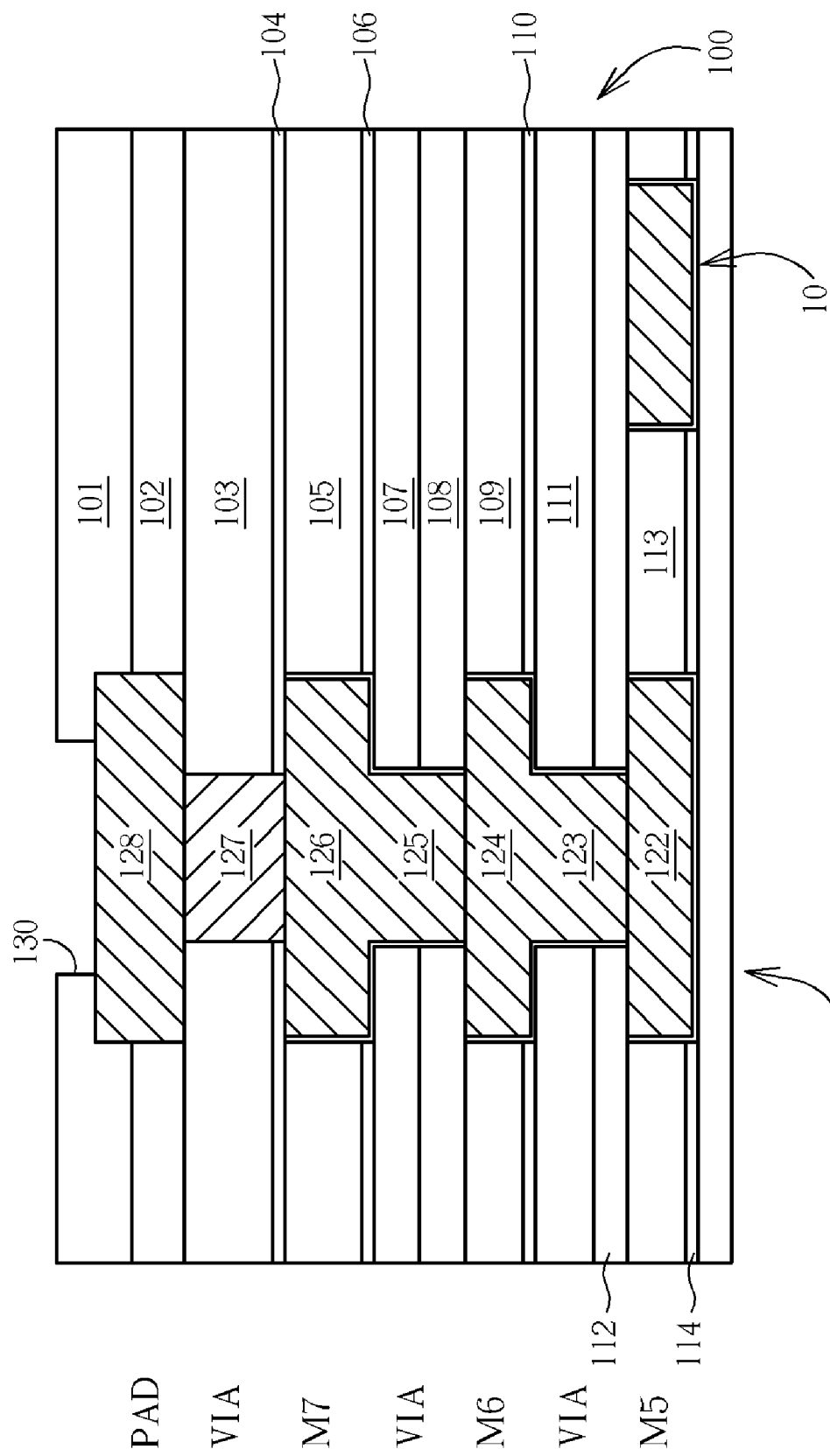
FIG. 1 illustrates a typical cross-section view of a fuse interconnect-wire that is formed concurrently with a multi-layered interconnect-wire structure on a silicon substrate.
Figure 2:
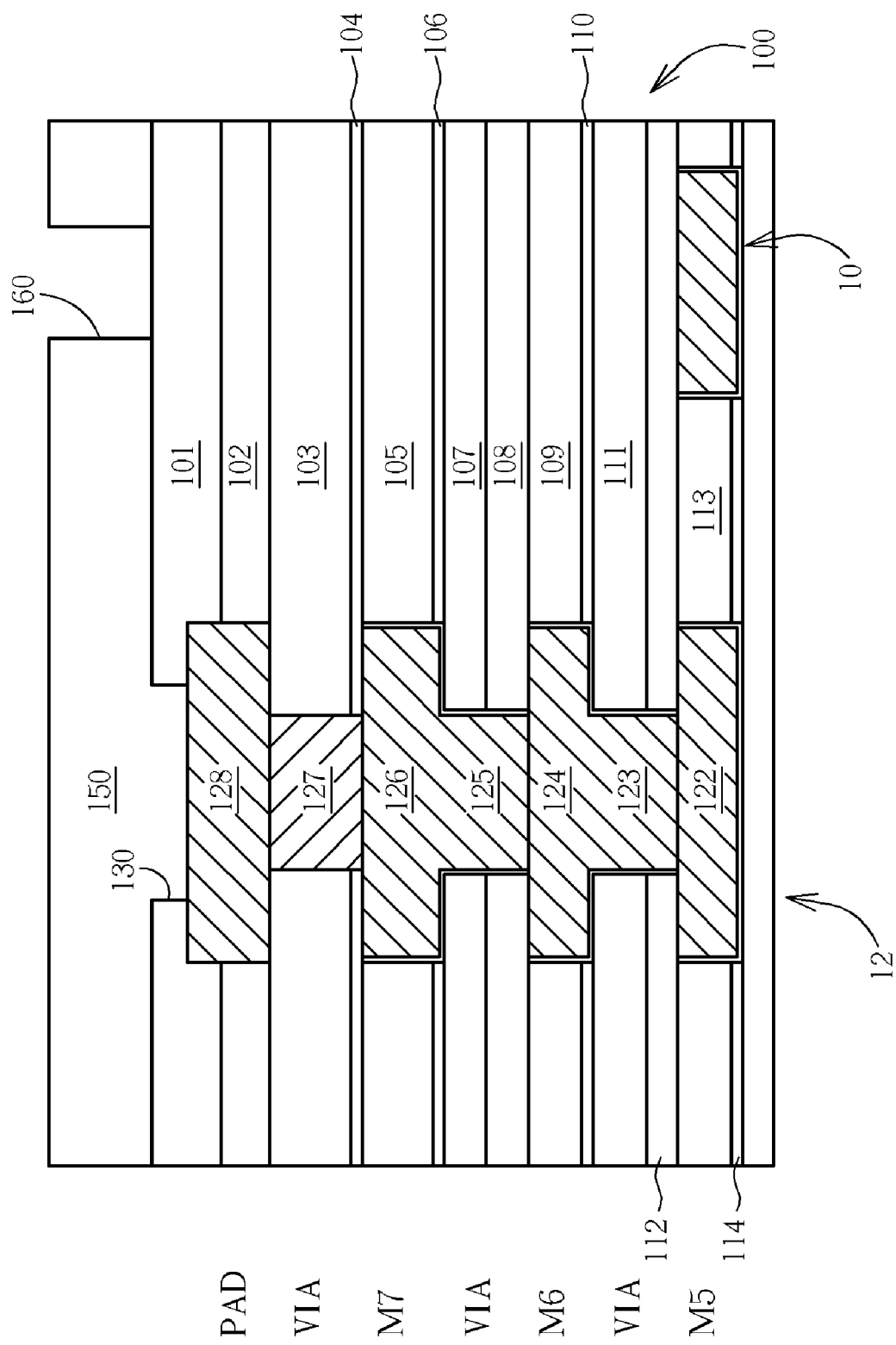
FIGS. 2-4 illustrate the process for etching the fuse window.
Figure 3:
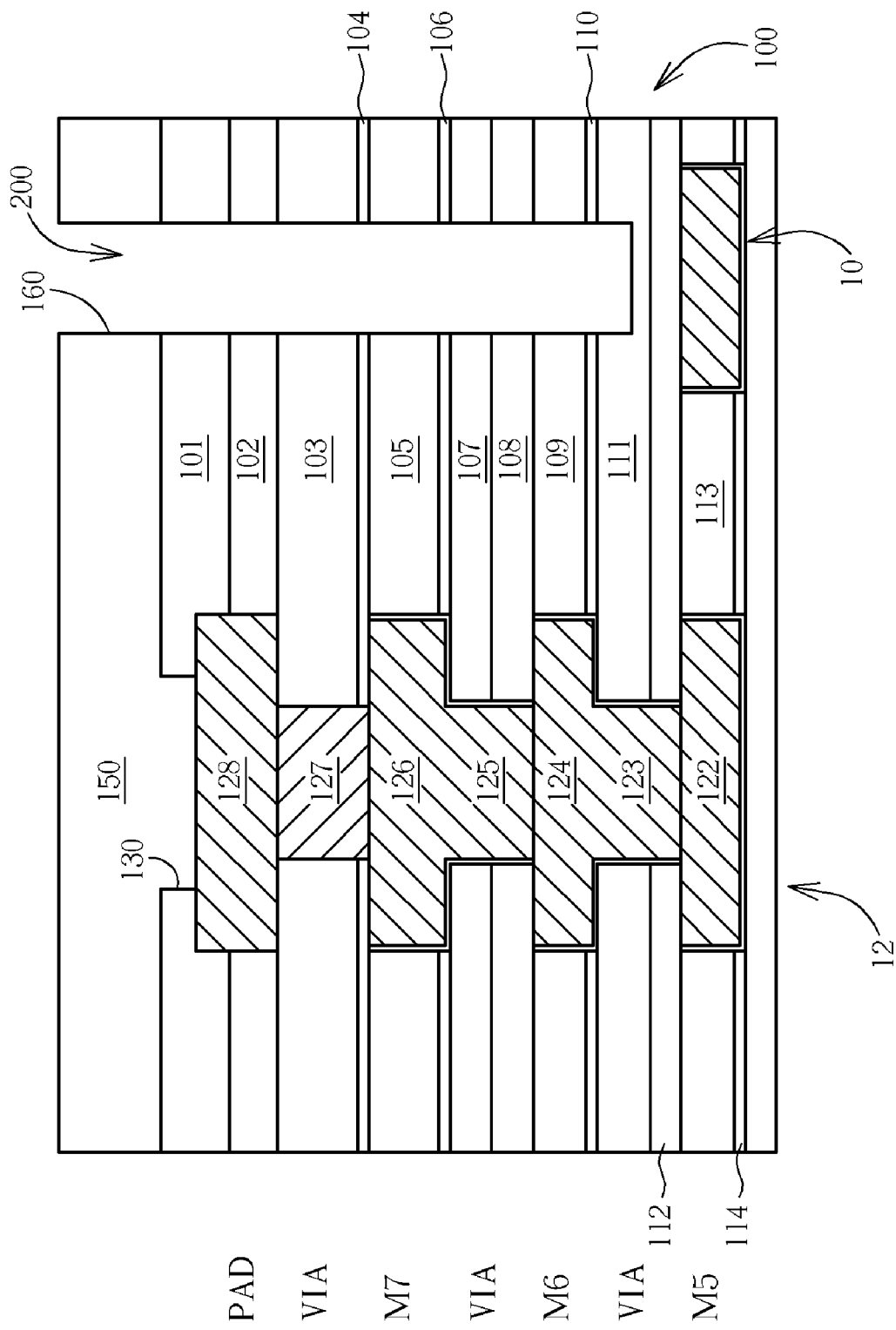
Figure 4:
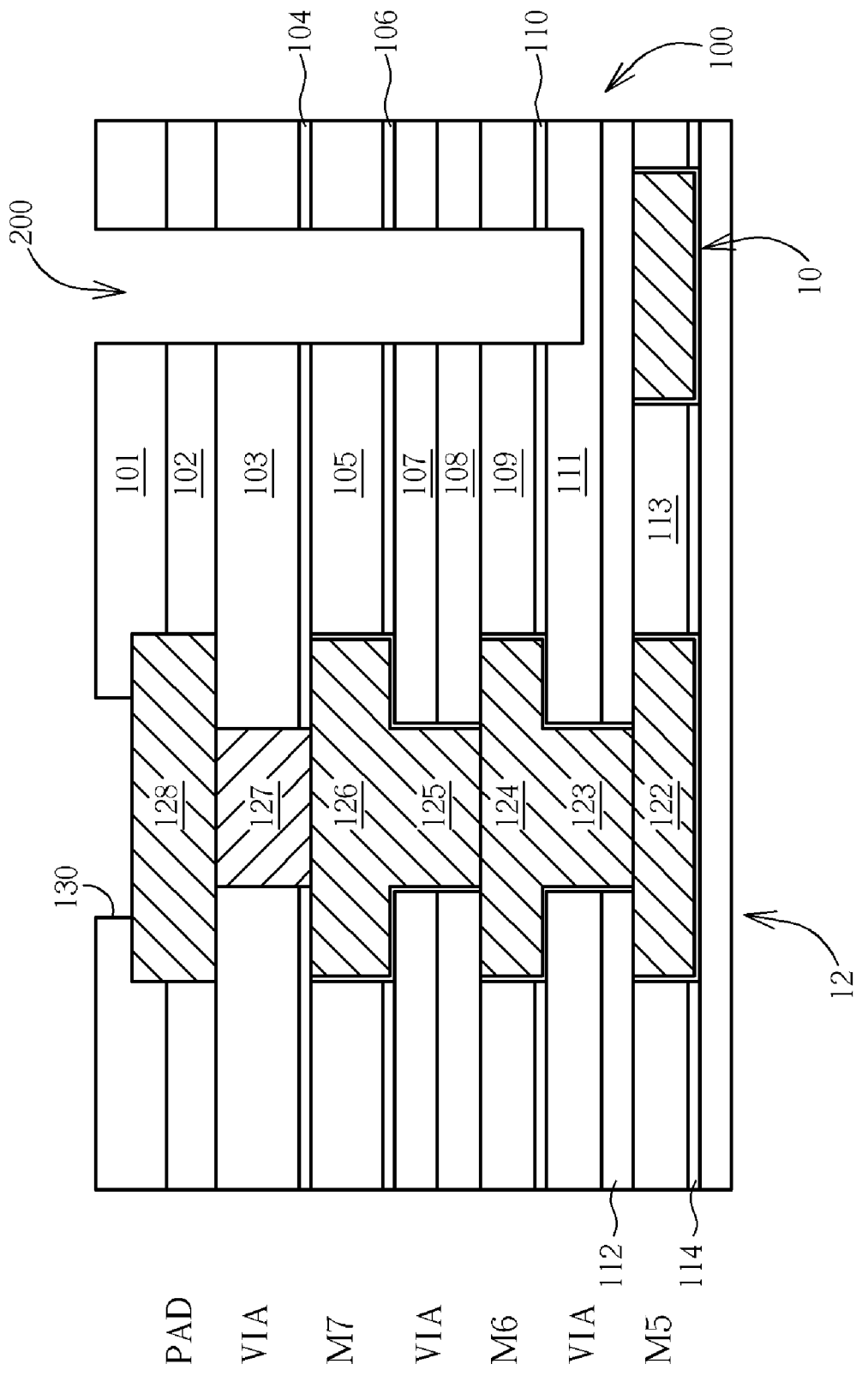
Figure 5:
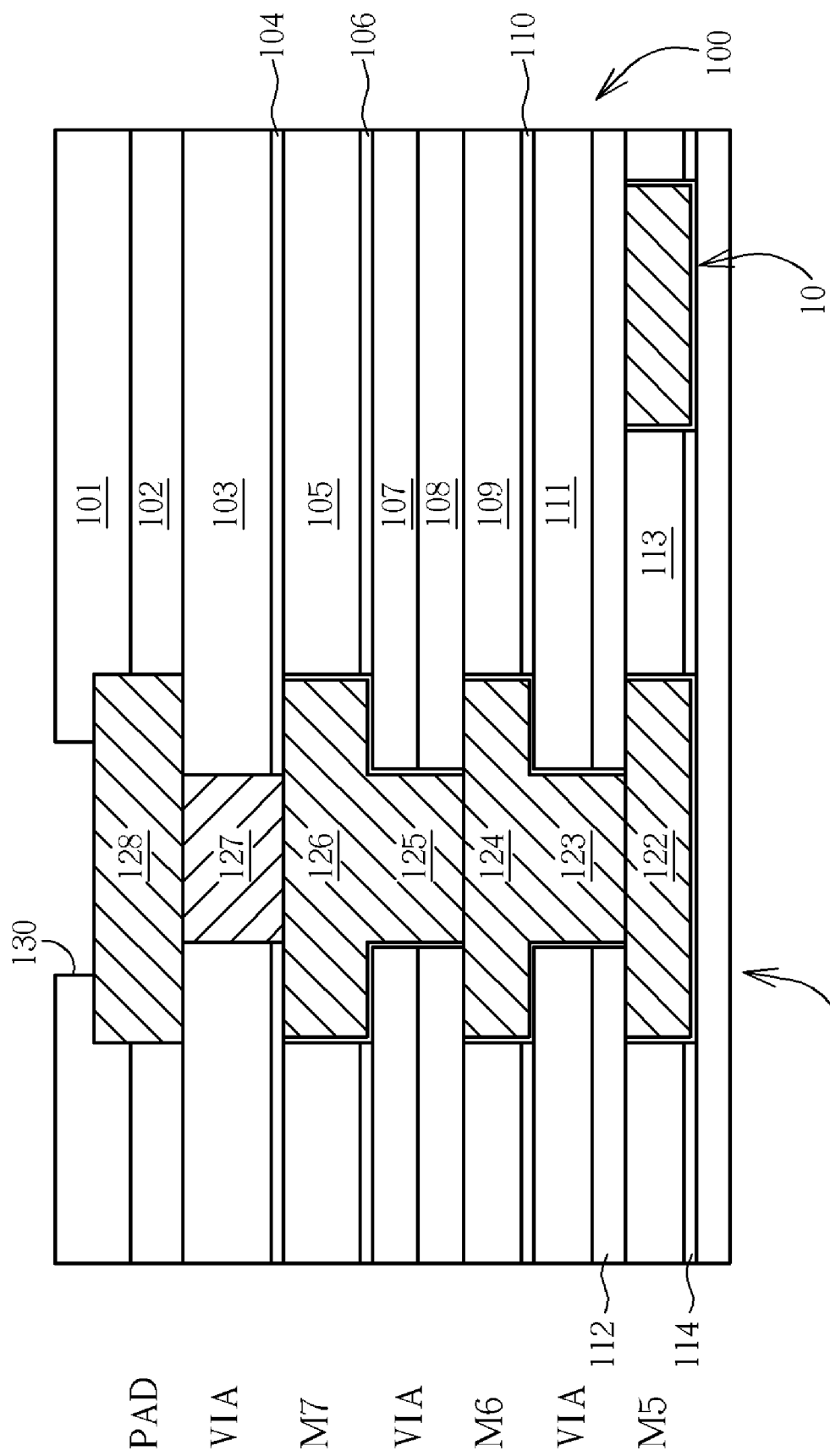
FIGS. 5-9 are schematic diagrams showing the two-step method for forming a fuse window on a semiconductor substrate in accordance with one preferred embodiment.

As shown in FIG. 5, likewise, a fuse interconnect-wire 10 is formed concurrently with a multi-layered interconnect-wire structure 12 on a silicon substrate 100. The interconnect-wire structure 12 comprises a lower inlaid wire layer 122 that is generally formed of copper by using copper damascene processes. The lower inlaid wire layer 122 may be, but not limited to, a fifth metal (M5) layer of the multi-layered interconnect-wire structure 12 wherein the first to fourth metal (M1-M4) layers are not shown in this figure for the sake of simplicity. The lower inlaid wire (M5) layer 122 is embedded in an insulating dielectric layer 113 and etch stop layer 114.

Similarly, the interconnect-wire structure 12 further comprises an inlaid wire (M6) layer 124 embedded in an insulating dielectric layer 109 and etch stop layer 110. The inlaid wire (M6) layer 124 is electrically interconnected with the lower inlaid wire (M5) layer 122 through the via 123 that is embedded in the insulating dielectric layer 111 and cap layer 112. The interconnect-wire structure 12 further comprises an inlaid wire (M7) layer 126 embedded in an insulating dielectric layer 105 and etch stop layer 106. The inlaid wire (M7) layer 126 is electrically interconnected with the inlaid wire (M6) layer 124 through via 125 that is embedded in the insulating dielectric layer 107 and cap layer 108. The interconnect-wire structure 12 further comprises a bonding pad layer 128 that is generally formed of Al, AlCu, Cu, or a composite. The bonding pad layer 128 is electrically interconnected with the underlying inlaid wire (M7) layer 126 through via 127 that is embedded in the insulating dielectric layer 103 and cap layer 104. The bonding pad layer 128 is protected with a passivation layer 101 and dielectric layer 102. An opening 130 is formed in the passivation layer 101 to expose a portion of the top surface of the bonding pad layer 128.

The insulating dielectric layers 105, 107, 109, 111 and 113 are made of low dielectric constant (low-k) materials such as FSG or the like. The etch stop layers 106, 110 and 114 are made of PECVD nitride, LPCVD nitride or oxy-nitride. The cap layers 104, 108, 110 and 112 are made of PECVD nitride, LPCVD nitride, carbide, silicon carbonitride or oxy-nitride. The dielectric layer 102 is generally formed of silicon oxide such as PECVD oxide. The passivation layer 101 is generally formed of silicon nitride.

As shown in FIG. 5, the fuse interconnect-wire 10 is formed concurrently with the lower inlaid wire (M5) layer 122 of the interconnect-wire structure 12. Both of the fuse interconnect-wire 10 and the lower inlaid wire (M5) layer 122 are formed in the insulating dielectric layer 113.

To form a fuse window for laser ablation directly above the fuse interconnect-wire 10, as previously mentioned, a total of 11 consecutive layers including five different types of dielectric materials are etched from the topmost layer 101 to the target layer 111. The prior art single-step non-stop dry etching process is carried out under endpoint mode and has to employ different etching recipes for selectively etching corresponding material layers above the fuse interconnect-wire 10 under said endpoint mode. The complicated dielectric film stack over the fuse interconnect-wire 10 introduces variations and accumulated errors of the final result. Therefore, prior art single-step non-stop dry etching process is time-consuming and is not reliable.

Figure 6:
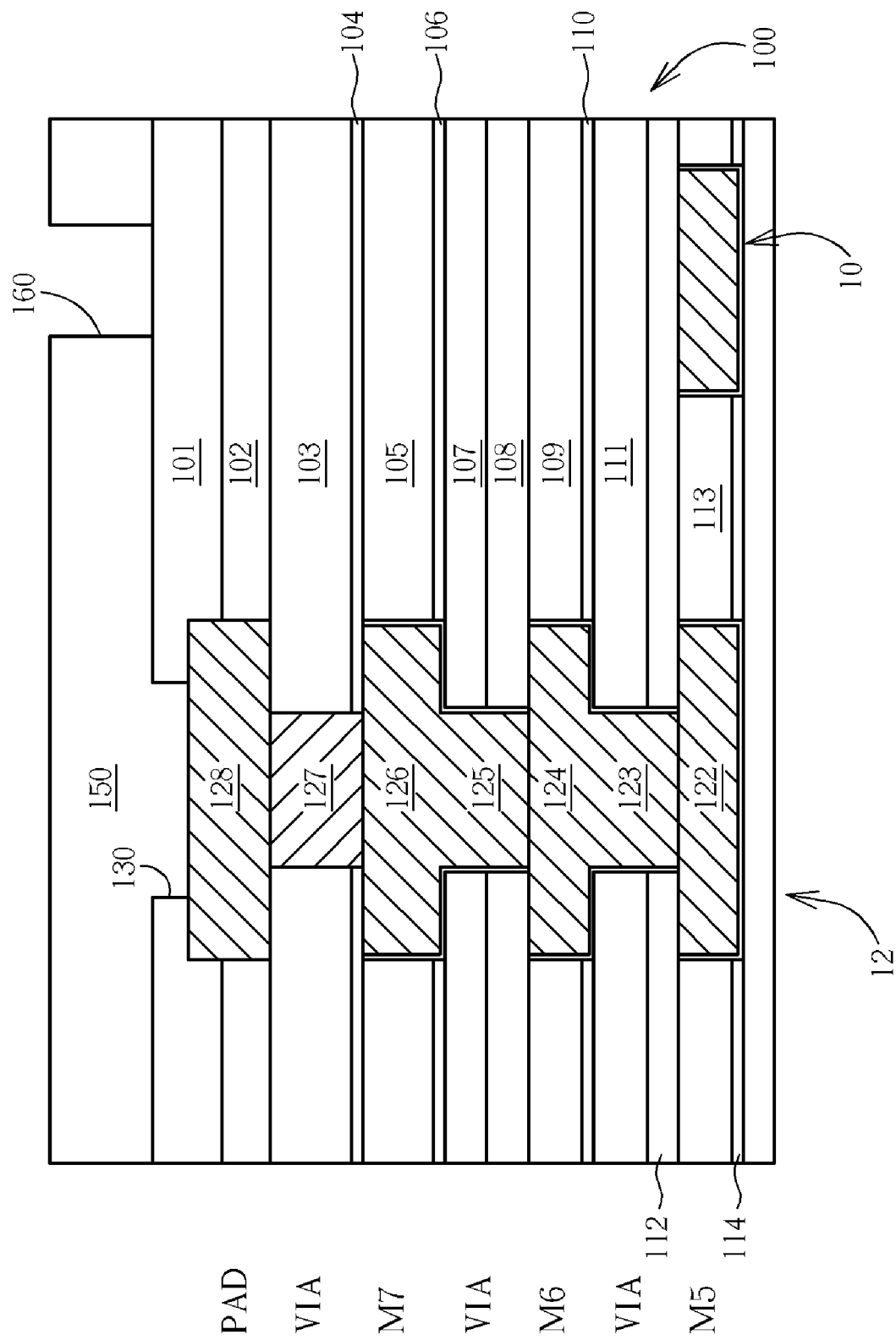

The process for etching the fuse window according to this invention is illustrated through FIGS. 6-9. As shown in FIG. 6, likewise, a photoresist layer 150 is coated on the passivation layer 101. A typical lithographic process is carried out to form an opening 160 in the photoresist layer 150. The opening 160 is situated directly above the fuse interconnect-wire 10 and defines the fuse window to be etched into the substrate 100.

Figure 7:
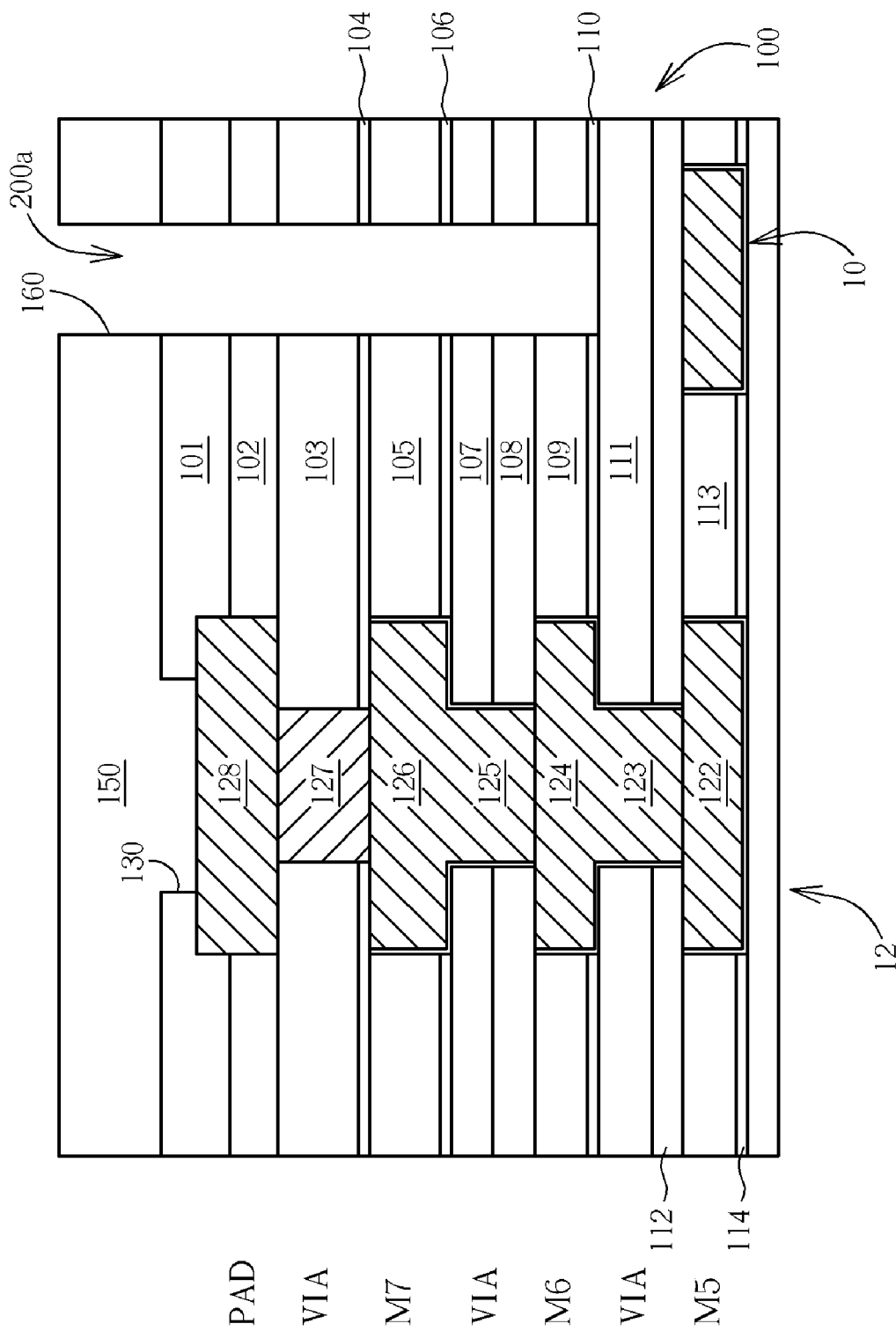

As shown in FIG. 7, a first dry etching process is then carried out under a time mode to consecutively and non-selectively etch the layers 101-110 and stops upon the exposure of the target layer 111, thereby forming an intermediate fuse window 200a. It is one salient feature of the invention that the first dry etching process is performed at a substantially constant etching rate based on the same etching recipe for etching through the layers 101 to 110. The term "time mode" means that the first dry etching process is terminated after a preset time period. The preset time period is calculated based on the etching rate of the etching recipe and the combined thickness of layers 101 to 110. The term "non-selectively etch the layers 101-110" means that the etching recipe employed in the first dry etching process is substantially not selective to the layers 101-110 which contains about at least three different kinds of dielectric materials such as PECVD oxide, FSG and nitride. The first dry etching process may also be referred to as "rough" etching, since the etching recipe employed in the first dry etching process is substantially non-selective to the consecutive layers 101 to 110.

According to the preferred embodiment of this invention, the etching recipe for etching through the layers 101 to 110 employed in the first dry etching process includes but not limited to: a chamber pressure of about 300 mtorr; a top power of about 1500 W; a bottom power of about 1500 W; a CF4 flow rate of about 100 sccm; a CHF3 flow rate of about 10 sccm; argon (Ar) flow rate of about 500 sccm; oxygen ($O_2$) flow rate of about 30 sccm; and a time period of about 360 seconds.

After the formation of the intermediate fuse window 200a, a first thickness-measurement step for advanced process control (APC) is performed. The thickness of the exposed target film 111 is measured. The measured thickness data is feedback to an APC unit (not shown).

As shown in FIG. 8, after the first thickness-measurement step, a second dry etching process is carried out, still under a time mode and under the control of APC unit, to precisely etch away a pre-selected thickness of the exposed target layer 110, thereby forming a finale fuse window 200. The APC unit provides the second dry etching process with a calculated etching time based on the feedback measured thickness data from the first thickness measurement step. Since the second dry etching process is relatively more precise than the first dry etching process, the second dry etching process is referred to as "fine" etching step. The etching recipe for the second dry etching process may be selective or non-selective with respect to the remaining layers.

After the second dry etching process, a second thickness-measurement step for quality control is performed. The thickness of the fine etched target film 111 is measured. If the thickness of the fine etched target film 111 is within the spec, the photoresist layer is stripped, as shown in FIG. 9.

FIG. 10 is a flow chart summarizing the two-step method of this invention. The present invention two-step, APC-controlled method for etching a fuse window includes the steps of:

Step 51: First etching step. Non-selective first dry etching etches through layers 101-110 to expose the target layer 111. The first etching step is performed at a substantially constant etching rate using only one etching recipe for all 10 consecutive layers and under time mode.

Step 52: First thickness measurement. After the first etching step, the thickness of the exposed target layer 111 is measured using known thickness measuring tools.

Step 53: APC control. The measured thickness data is feedback to the APC unit to output an etching duration for the next fine etching step.

Step 54: Second etching step. The APC unit controls the second etching step to precisely remove a predetermined thickness of the target layer 111.

Step 55: Second thickness measurement. After the second etching step, the thickness of the fine etched target layer 111 is measured using known thickness measuring tools.

Step 56: The photoresist layer is stripped.

Figure 11:
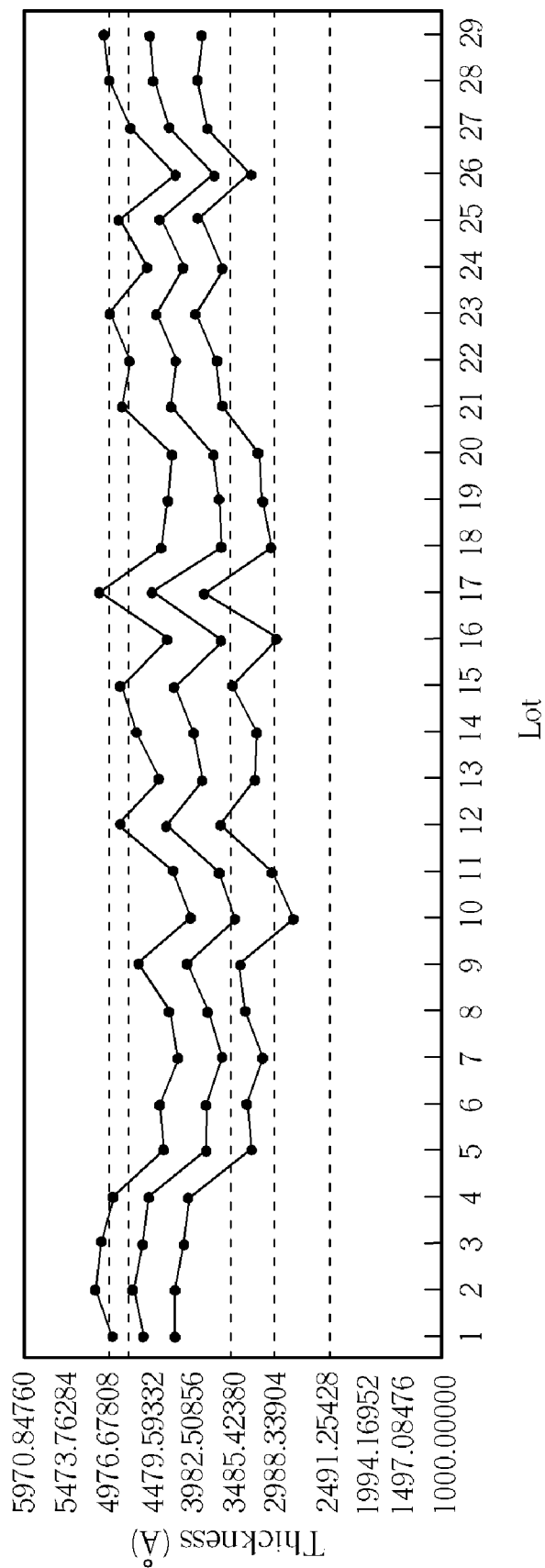
FIG. 11 illustrates the lot-to-lot thickness variation curve at the bottom of the intermediate fuse window 200a after the first etching process.
Figure 12:
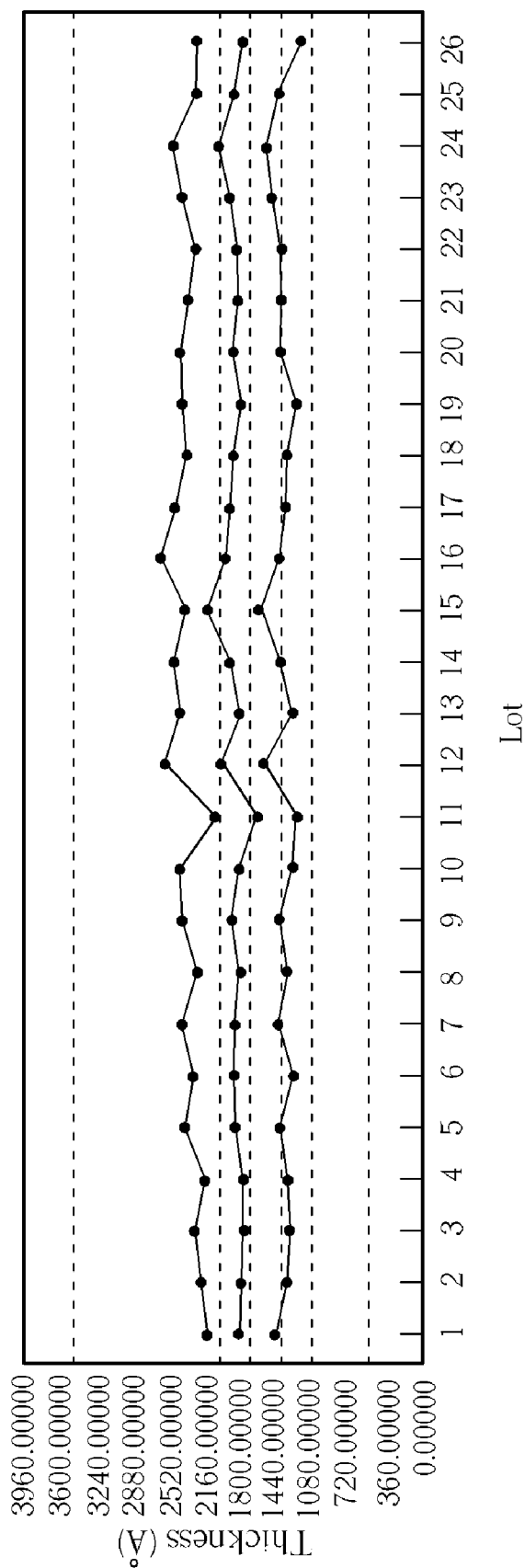
FIG. 12 illustrates the lot-to-lot thickness variation curve at the bottom of the finale fuse window 200 after the second etching process.

FIG. 11 illustrates the lot-to-lot thickness variation curve at the bottom of the intermediate fuse window 200a after the first etching process. FIG. 12 illustrates the lot-to-lot thickness variation curve at the bottom of the finale fuse window 200 after the second etching process. In this case, for example, the target FSG layer 111 has a thickness of about 5000 angstroms. After the first dry etching step, the tolerable range of the remaining target FSG layer 111 is 4000±1400 angstroms. After the second dry etching process, the remaining thickness of the target layer 111 is 2000±200 angstroms. The lot-to-lot variation is improved using the present invention two-step, APC-controlled method.

Figure 13:
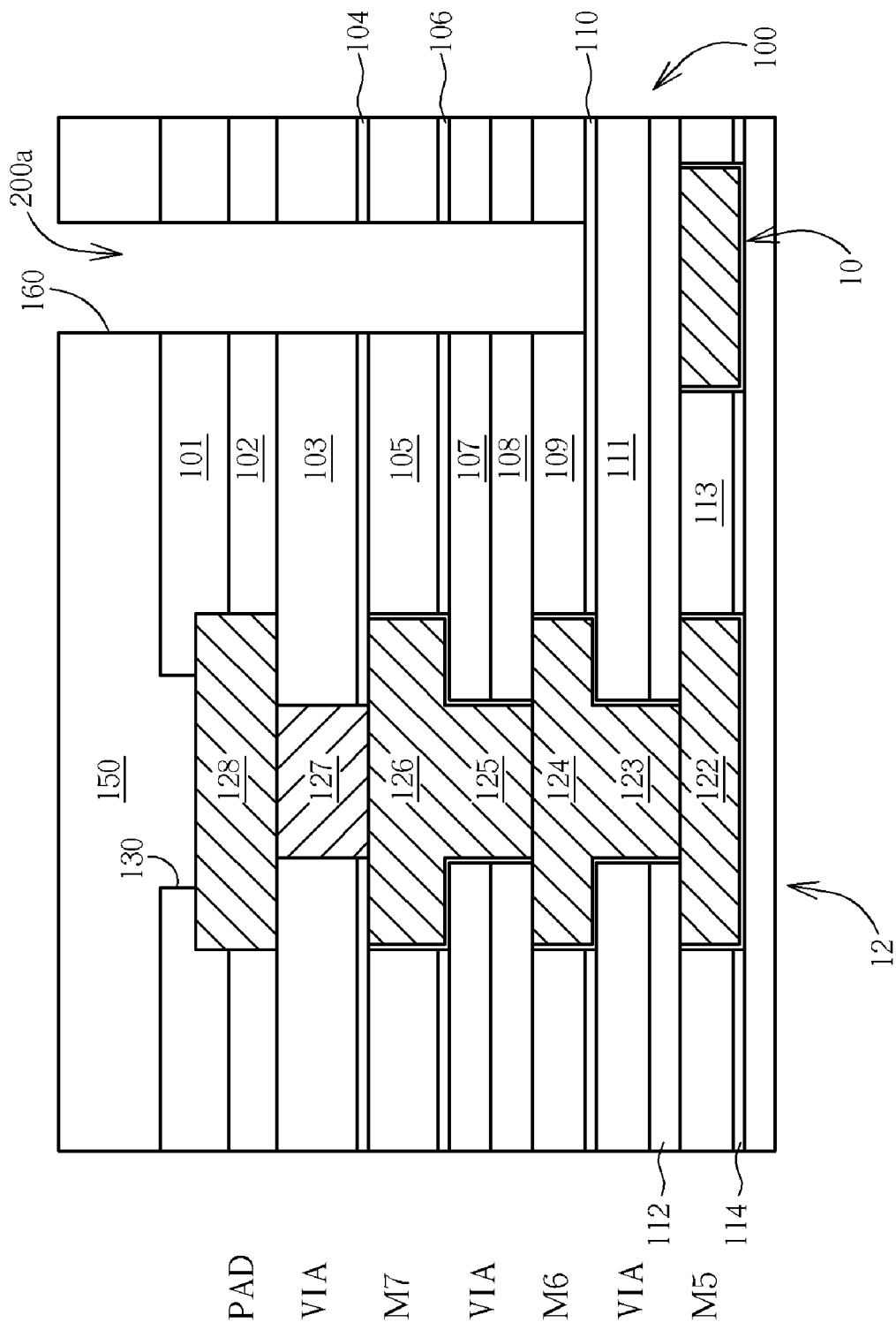
FIGS. 13 and 14 are schematic, cross-sectional diagrams illustrating the two-step, APC-controlled method for etching a fuse window on a semiconductor substrate in accordance with another preferred embodiment of this invention.
Figure 14:
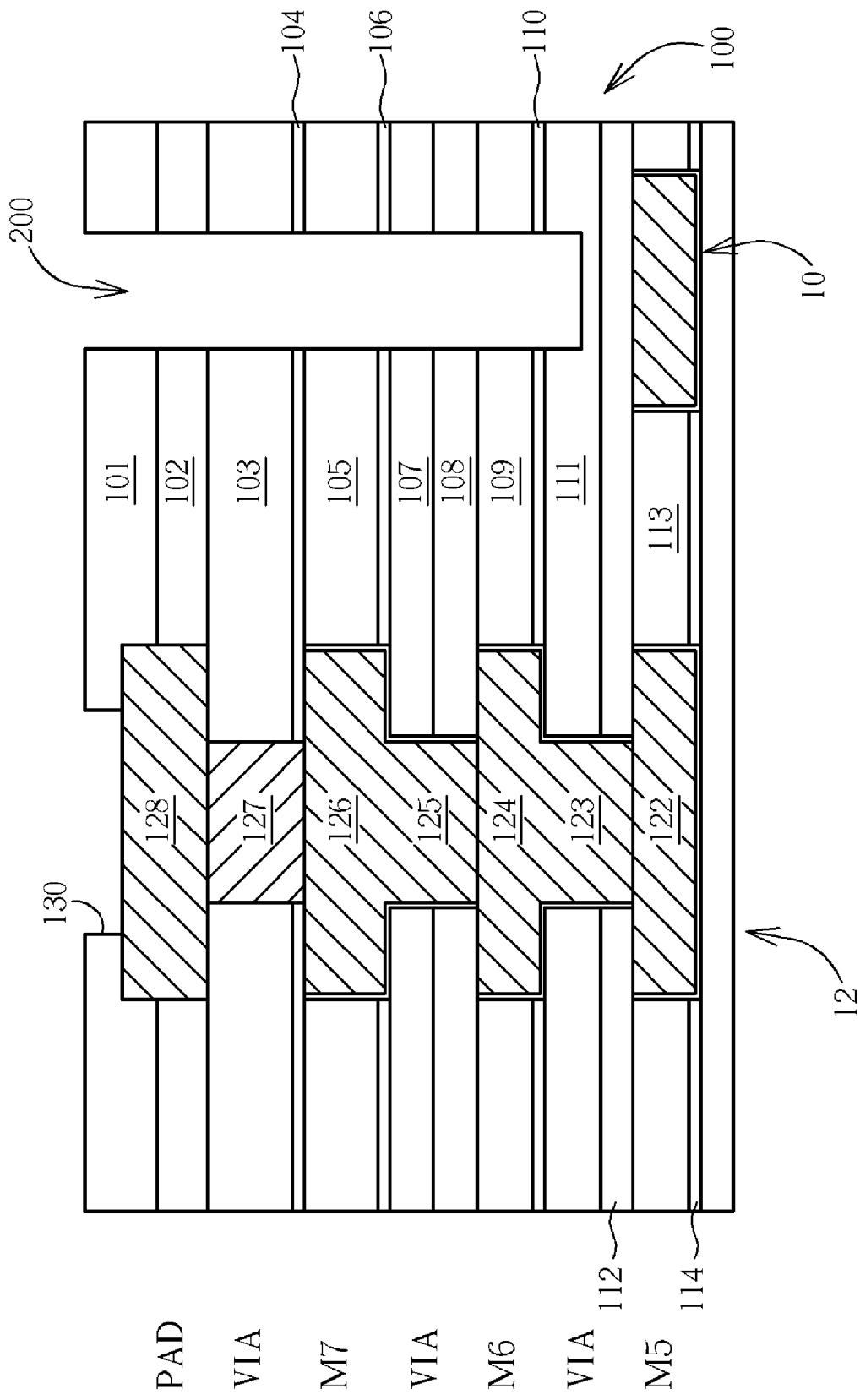

FIGS. 13 and 14 are schematic, cross-sectional diagrams illustrating the two-step, APC-controlled method for etching a fuse window on a semiconductor substrate in accordance with another preferred embodiment of this invention. As shown in FIGS. 13 and 14, according to this embodiment, the first dry etching step does not expose the target layer 111, but stops on the layer 110 that overlies the target layer 111. Thereafter, the thickness of the remaining layers 110-112 is measured using known thickness measuring tools. Likewise, the measured thickness data is feedback to the APC unit to output an etching duration for the next fine etching step. A second etching step using non-selective etch recipe under APC control is performed to carefully remove the layer 110 and a predetermined thickness of the target layer 111. After the second etching step, the thickness of the fine etched target layer 111 is measured using known thickness measuring tools. Finally, the photoresist layer is stripped.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A two-step method for etching a fuse window on a semiconductor substrate, comprising:

providing a semiconductor substrate having thereon a fuse interconnect-wire embedded in a dielectric film stack, wherein said dielectric film stack comprises a target dielectric layer overlying said fuse interconnect-wire, at least one intermediate dielectric material layer overlying said target dielectric layer, and a passivation layer overlying said intermediate dielectric material layer, a photoresist layer disposed over said passivation layer, wherein said photoresist layer has an opening that is directly above said fuse interconnect-wire and defines said fuse window;

performing a first dry etching process to non-selectively etch said passivation layer and said intermediate dielectric material layer through said opening thereby exposing said target dielectric layer;

performing a first thickness-measurement step to measure thickness of said target dielectric layer after said first dry etching process;

performing a second dry etching process, based on said measured thickness of said target dielectric layer in said first thickness-measurement step, to etch away a portion of said exposed target dielectric layer, thereby forming said fuse window; and performing a second thickness-measurement step to measure a remaining thickness of said target dielectric layer after said second dry etching process.

2. The method of claim 1 wherein said passivation layer, said intermediate dielectric material layer and said target dielectric layer are made of different dielectric materials.

3. The method of claim 1 wherein said passivation layer comprises silicon oxide.

4. The method of claim 1 wherein said intermediate dielectric material layer comprises silicon nitride.

5. The method of claim 1 wherein said target dielectric layer comprises FSG.

6. The method of claim 1 wherein a cap layer is formed between said target dielectric layer and said fuse interconnect-wire.

7. The method of claim 6 wherein said cap layer comprises silicon nitride and silicon carbide.

8. The method of claim 1 wherein said measured thickness is feedback to an advanced process control (APC) unit to output an etching duration for said second dry etching process.

9. The method of claim 1, wherein said first dry etching process is performed during a first period time, wherein said first period time is calculated based on the etching rate and the combined thickness from said intermediate dielectric material layer to said passivation layer.

10. The method of claim 1, wherein said first dry etching process is performed based on the same etching recipe.

11. A two-step method for etching a fuse window on a semiconductor substrate, comprising:

providing a semiconductor substrate having thereon a fuse interconnect-wire embedded in a dielectric film stack, wherein said dielectric film stack comprises a target dielectric layer overlying said fuse interconnect-wire, a first intermediate dielectric material layer overlying said target dielectric layer, a second intermediate dielectric material layer overlying said first intermediate dielectric material layer, and a passivation layer overlying said second intermediate dielectric material layer, a photoresist layer disposed over said passivation layer, wherein said photoresist layer has an opening that is directly above said fuse interconnect-wire and defines said fuse window;

performing a first dry etching process to non-selectively etch said passivation layer and said second intermediate dielectric material layer through said opening thereby forming an intermediate fuse window in said passivation layer and said second intermediate dielectric material layer;

performing a first thickness-measurement step to measure combined thickness of remaining said second intermediate dielectric material layer, said first intermediate dielectric material layer and said target dielectric layer after said first dry etching process;

performing a second dry etching process, based on said measured thickness obtained from said first thickness-measurement step, to continue to etch said second intermediate dielectric material layer, said first intermediate dielectric material layer and a portion of said exposed target dielectric layer through said intermediate fuse window, thereby forming said fuse window; and performing a second thickness-measurement step to measure a remaining thickness of said target dielectric layer after said second dry etching process.

12. The method of claim 11 wherein said passivation layer comprises silicon oxide.

13. The method of claim 11 wherein said first intermediate dielectric material layer comprises silicon nitride.

14. The method of claim 11 wherein said second intermediate dielectric material layer is formed of different dielectric material from said first intermediate dielectric material layer.

15. The method of claim 11 wherein said target dielectric layer comprises FSG.

16. The method of claim 11 wherein a cap layer is formed between said target dielectric layer and said fuse interconnect-wire.

17. The method of claim 16 wherein said cap layer comprises silicon nitride and silicon carbide.

18. The method of claim 11 wherein said measured thickness is feedback to an advanced process control (APC) unit to output an etching duration for said second dry etching process.

19. The method of claim 11 wherein said semiconductor substrate has thereon a multi-layered interconnect-wire structure formed in the dielectric film stack and said fuse interconnect-wire formed concurrently with a lower inlaid wire layer of said multi-layered interconnect-wire structure.

20. The method of claim 19 wherein said lower inlaid wire layer and said fuse interconnect-wire are both made of copper.

21. The method of claim 11, wherein said first dry etching process is performed during a first period time, wherein said first period time is calculated based on the etching rate and the combined thickness from said second intermediate dielectric material layer to said passivation layer.

22. The method of claim 11, wherein said first dry etching process is performed based on the same etching recipe.

* * * * *